US008194874B2

(12) United States Patent
Starobin et al.

(10) Patent No.: US 8,194,874 B2
(45) Date of Patent: Jun. 5, 2012

(54) IN-ROOM ACOUSTIC MAGNITUDE RESPONSE SMOOTHING VIA SUMMATION OF CORRECTION SIGNALS

(75) Inventors: Bradley M. Starobin, Baltimore, MD (US); Richard H. Lyon, Belmont, MA (US); Christopher N. Blair, Milford, CT (US)

(73) Assignee: Polk Audio, Inc., Baltimore, MD (US)

( * ) Notice: Subject to any disclaimer, the term of this patent is extended or adjusted under 35 U.S.C. 154(b) by 1021 days.

(21) Appl. No.: 12/153,623

(22) Filed: May 21, 2008

(65) Prior Publication Data

US 2008/0298604 A1 Dec. 4, 2008

Related U.S. Application Data

(60) Provisional application No. 60/924,612, filed on May 22, 2007.

(51) Int. Cl.
*H04R 3/02* (2006.01)
(52) U.S. Cl. .................. 381/73.1; 381/71.8; 381/71.11; 381/94.9
(58) Field of Classification Search ............... 381/73.1, 381/71.8, 71.11, 94.9
See application file for complete search history.

(56) References Cited

U.S. PATENT DOCUMENTS

| 4,130,727 | A | | 12/1978 | Kates |
| 4,878,188 | A | * | 10/1989 | Ziegler, Jr. ............ 708/300 |
| 4,972,489 | A | | 11/1990 | Oki et al. |
| 4,980,914 | A | | 12/1990 | Kunugi et al. |
| 5,559,891 | A | * | 9/1996 | Kuusama et al. ............ 381/63 |
| 5,627,899 | A | | 5/1997 | Craven et al. |
| 2002/0126852 | A1 | * | 9/2002 | Kashani ............... 381/71.4 |
| 2004/0042625 | A1 | | 3/2004 | Brown |

FOREIGN PATENT DOCUMENTS

EP 1600941 A1 11/2005
JP 58-198914 11/1983

OTHER PUBLICATIONS

International Search Report to PCT Application No. US2008/006521, dated Sep. 4, 2008, 5 pages.
Written Opinion to PCT Application No. US2008/006521, dated Sep. 4, 2008, 6 pages.

* cited by examiner

*Primary Examiner* — Zandra Smith
*Assistant Examiner* — Paul Patton
(74) *Attorney, Agent, or Firm* — J. A. McKinney; Aimee Joshua

(57) ABSTRACT

A system and method are provided for smoothing the in-room acoustic magnitude response of an audio reproduction system. An in-room acoustic magnitude response analysis is performed to determine a room resonance induced peak associated with an audio signal. A replica of the audio signal is filtered at the room resonance induced peak. The filtered replica signal is added with the audio signal. Through this, smoothing of the room resonance induced peak may be achieved, such that a subjective impression of transient response and dynamics of the audio signal are preserved.

20 Claims, 3 Drawing Sheets

IN-ROOM ACOUSTIC MAGNITUDE RESPONSE SMOOTHING VIA SUMMATION OF CORRECTION SIGNALS

CROSS REFERENCE TO RELATED APPLICATIONS

This application claims the benefit under 35 U.S.C. §119 (e) to U.S. Provisional Patent Application No. 60/924,612, filed May 22, 2007, which is incorporated by reference herein in its entirety.

BACKGROUND

An in-room acoustic magnitude response of an audio system, in the absence of corrective or compensatory measures, may be dominated by resonant effects. Low-frequency "standing waves," whose resonant frequencies are generally affected by the major dimensions and shape of an acoustic space, may impose severe peaks (e.g., pressure maxima, known as "antinodes") and notches (e.g., pressure minima or "nodes") on an in-room acoustic response of a loudspeaker system within the acoustic space. The mechanisms by which such resonant modes are excited are fairly well understood, and many different methods may be employed to control these resonant modes so as to achieve a smooth measured in-room acoustic magnitude response that is free of peaks and notches. Such smooth, flat acoustic response curves, indicative of an audio system that neither favors nor fails to reproduce any portions of its passband, are typically preferred over a magnitude response characterized by severe peaks and notches. However, the transient response of the system, i.e., the ability of the system to respond quickly and accurately as the input signal starts and stops, is also an important part of perceived system performance. This aspect of system performance is both difficult to measure and very difficult to preserve when applying known techniques for the control of room induced resonant modes.

Conventional methods for achieving a smooth in-room acoustic magnitude response have focused on various techniques for measuring the uncorrected in-room response and the application of magnitude response equalization using various devices. Many methods have been proposed for correction of the in-room magnitude response of an audio reproduction system. Typically, these methods include a device to measure the in-room magnitude response of the audio system at a specific listening location, a device to derive a corrective filter, and a device to apply a corrective filter to an input signal prior to reproduction by the audio system. The corrective filter is typically composed of narrow band attenuation filters located at the frequencies where the resonant behavior of the room causes peaks in the in-room magnitude response. Appropriate attenuation of these peaks will produce a more or less smooth and flat in-room magnitude response. There are, however, two significant shortcomings of these systems. First, the modal density of the room, particularly at mid and higher frequencies, may be so high as to make the corrective filters extremely complex and impractical to implement even with digital techniques. Second, all resonant modes take a certain amount of time to establish themselves in the room. This means that the initial sound, immediately following the onset of the input signal, is unaffected by the resonant behavior of the room. However, in some systems the band attenuation filters of correction methods are applied continuously to the input signals, and attenuate both the initial and steady state portions of the sound. This leads to poor transient response and the subjective impression that the system does not exhibit dynamics or impact.

Some prior methods have recognized the need to accommodate both time and frequency domains room correction methods so as to preserve proper transient response. For example, some employ two corrective filters with different characteristics. One corrective filter modifies the initial sound and the other corrective filter, after a delay, modifies the later or steady state sound. This may help to preserve proper transient response of the initial sound. However, the method requires derivation of two possibly complex correction filters and manual adjustment of the delay for application of the second filter. Another prior method digitally creates a corrective filter in the time domain using Frequency Induced Resonance (FIR) type filters. In theory, such a digital system for time domain modification of the input signal should provide perfect correction of the in-room response of the system in both the time and frequency domains. However, subsequent advances in digital signal processing theory have shown that the characteristics of FIR filters make implementation of this method impractical even with current digital signal processing (DSP) hardware. In addition, as is now well known, digital time domain techniques are limited in their ability to correct signal problems resulting from stored or delayed energy, such as in room resonances.

Therefore, what is needed is a system and method through which an in-room performance of an audio system, as measured in part by an associated acoustic in-room magnitude response, may be improved, without compromising dynamic or transient performance.

SUMMARY

In a first embodiment of the present invention, there is provided a method comprising the following steps. Performing an in-room acoustic magnitude response analysis to determine a room resonance induced peak associated with an audio signal. Filtering a replica of the audio signal at the room resonance induced peak. Adding the filtered replica signal with the audio signal, whereby smoothing the room resonance induced peak is achieved, such that a subjective impression of transient response and dynamics of the audio signal are preserved.

In another embodiment of the present invention, there is provided acoustic magnitude response analysis device, a filter, and an adder. The acoustic magnitude response analysis device is configured to determine a room resonance induced peak. The filter is configured to filter a replica of an audio signal at the room resonance induced peak. The adder is configured to add the filtered replica signal with the audio signal, whereby a subjective impression of transient response and dynamics of the audio signal are preserved.

Further embodiments, features, and advantages of the invention, as well as the structure and operation of the various embodiments of the invention are described in detail below with reference to accompanying drawings.

BRIEF DESCRIPTION OF THE DRAWINGS/FIGURES

Embodiments of the invention are described with reference to the accompanying drawings. In the drawings, like reference numbers may indicate identical or functionally similar elements. The drawing in which an element first appears is generally indicated by the left-most digit in the corresponding reference number.

DETAILED DESCRIPTION

Figure 1:
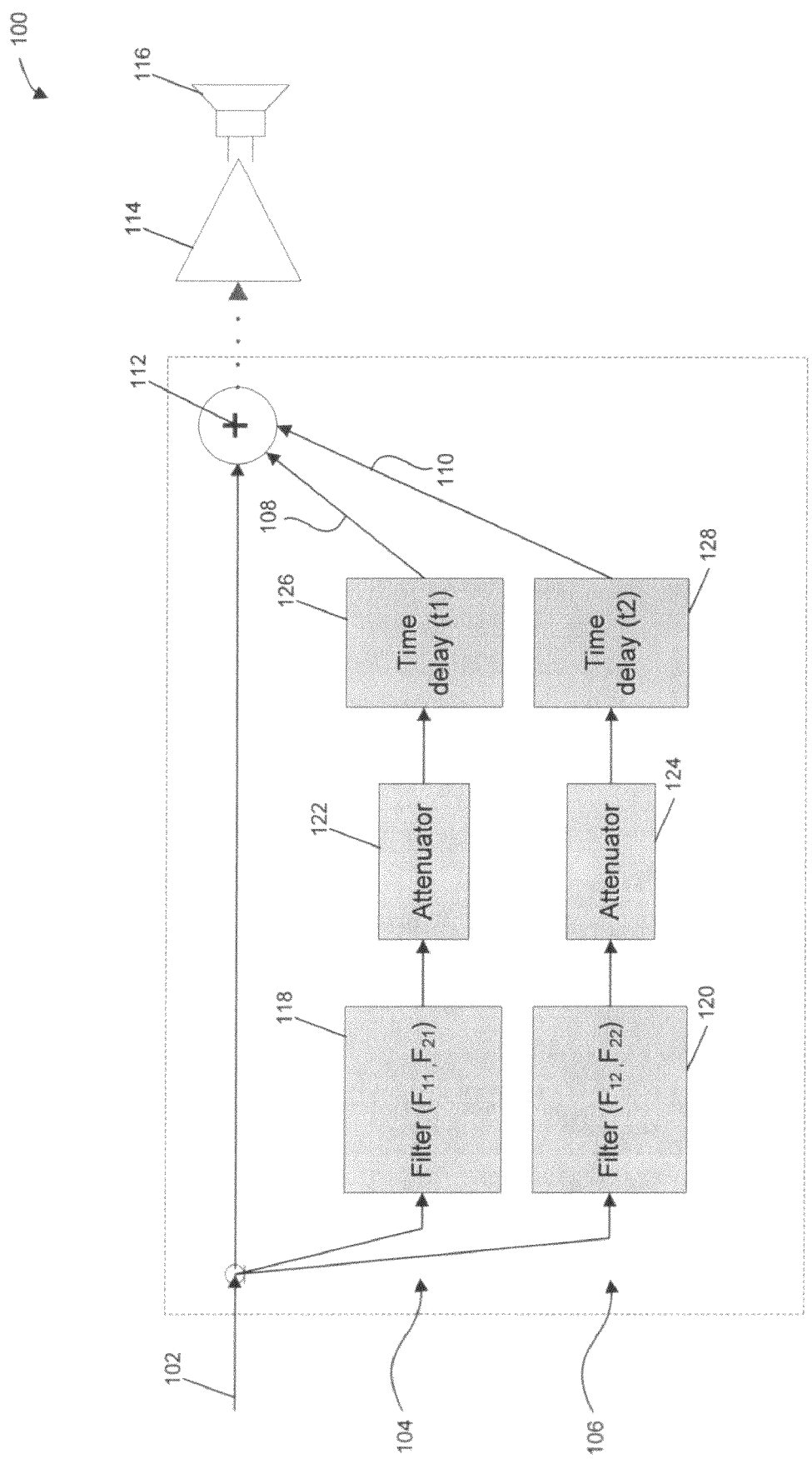
FIG. 1 is a diagram that illustrates a room-correction algorithm, according to an embodiment of the present invention.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor(s), and thus, are not intended to limit the present invention and the appended claims in any way. For the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention provide a method and system by which an in-room performance of an audio system, as measured in part by an associated acoustic in-room magnitude response, may be improved, without compromising dynamic or transient performance. In particular, embodiments of the present invention provide a system and method for correction of the in-room magnitude response in a low frequency range that may be applied to in-room correction of a low frequency driver, such as a subwoofer.

The inventors have observed that the principles by which acoustic standing waves are excited and sustained—their associated frequencies and the notion of constructive (additive) and destructive (subtractive) interference—suggest a way for the deleterious performance artifacts of room modes may be substantially eliminated within a low-modal density low-frequency regime of an acoustic space. Embodiments of the present invention utilize destructive interference in a novel manner that preserves the amplitude verses time response (also known as "transient response," and generally a measure of dynamic capability) of the native program material.

Accordingly, embodiments of the present invention provide a method and system for smoothing in-room acoustic magnitude response of an audio reproduction system that preserves subjective impression of transient response and dynamics, and which can be readily and economically implemented. For example, this may provide a fully automated method and system for correcting the in-room acoustic magnitude response of a subwoofer, so as to preserve the subjective impression of transient response and dynamics, such that the resulting in-room response is relatively smooth and free of room resonance induced peaks.

Embodiments of the present invention utilize time-delayed, or latent, superposition of an appropriately band-pass filtered copy or replica of a program signal with an unaltered program signal itself. This corrective signal is derived via analysis of an in-room acoustic magnitude response near a listening area. That is, a loudspeaker (source) to listener (receiver) transfer function, dependent in part on physical characteristics of an associated acoustic space, is analyzed to determine whether there are addressable acoustic response peaks. Peaks are regarded as addressable if their magnitude exceeds a mean level through a passband of the loudspeaker or a prescribed sub-passband of, for example, about ⅓ octave about the frequency at which the peak occurs by a prescribed differential, for example, greater than or equal to about 3.0 decibels (dB). The corrective signal is simply a bandpassed replica of the native program signal, where the bandpass filter (BPF) is centered at the frequency peak to be addressed, and the time delay is substantially equal to an odd integer (e.g., 1, 3, etc.) of one-half periods of the frequency of the addressable peak.

FIG. 1 is a diagram that illustrates a room-correction algorithm 100, according to an embodiment of the present invention. A received signal 102 is processed through first and second branches 104 and 106. After being processed, the received signal 102 and first and second processed signals 108 and 110 from respective ones of the first and second branches 104 and 106 are mixed or added in adder 112 before being received by an amplifier 114 and a loud speaker 116. For example, the processed signals 108 and 110 can be referred to as "corrective" signals. Each of the first and second branches 104 and 106 includes a filter 118 and 120 (e.g., band pass filters), an attenuator 122 and 124, and a time delay 126 and 128. For example, the first branch 104 includes band pass filter ($F_{11}$, $F_{21}$) 118, attenuator 122, and time delay $t_1$ 126, while second branch 106 includes band pass filter ($F_{12}$, $F_{22}$) 120, attenuator 124, and time delay $t_2$ 128.

In an exemplary operation, time delay $t_i$ equals $1/f_{ci}$ where $f_{ci}$ is the center frequency (in Hertz) of addressable peak "i". More generally, $t_i = A/(2f_{ci})$ where A is an odd integer less than or equal to 5 (i.e., 1, 3 or 5). Since the delay is an odd multiple of half the period of the addressable peak, the corrective signal is about 180 degrees out of phase at that frequency when summed back into the input signal, and the corrective signal serves to attenuate the peak frequency after a short delay. For example, a delay corresponding to A=1, 3 or 5 is sufficient to maintain the perception of transient response and dynamics, while delays corresponding to A greater than 5 may be perceived as echoes. It is to be appreciated that the number of addressable peaks may be arbitrarily large. However, in a typical consumer listening space, correction of three addressable peaks is typically sufficient. Also, it should be noted that, as determined by careful listening, typically it is not subjectively desirable to reduce acoustic output below about 40 Hz regardless of the existence of addressable peaks in that range. However, for subwoofer applications, it may be desirable to extend the correction passband's upper boundary by as much as one octave above the subwoofer system's high-frequency cutoff.

The techniques by which a loudspeaker's in-room acoustic magnitude response (or equivalently, the associated loudspeaker-to-listener transfer function) may be derived are well known in the art. By way of example, and not of limitation, techniques include swept sine wave, tone burst, maximum length sequence (MLS) stimuli, and many others. Any known method for determining the addressable peaks for correction can be used in conjunction with the present invention, as would become apparent to persons skilled in the relevant art.

Frequency resolution may not be critical because embodiments of the present invention can be applied to addressable peaks identified in bands as broad as one octave. However, finer frequency resolution may yield more accurate room correction using the techniques of the embodiments of the present invention. Spatial averaging of the loudspeaker's in-room acoustic magnitude response can also be used, for example, by sweeping the measurement microphone through the listening space during acquisition, or via discrete measurements, and appropriate signal processing.

Figure 2:
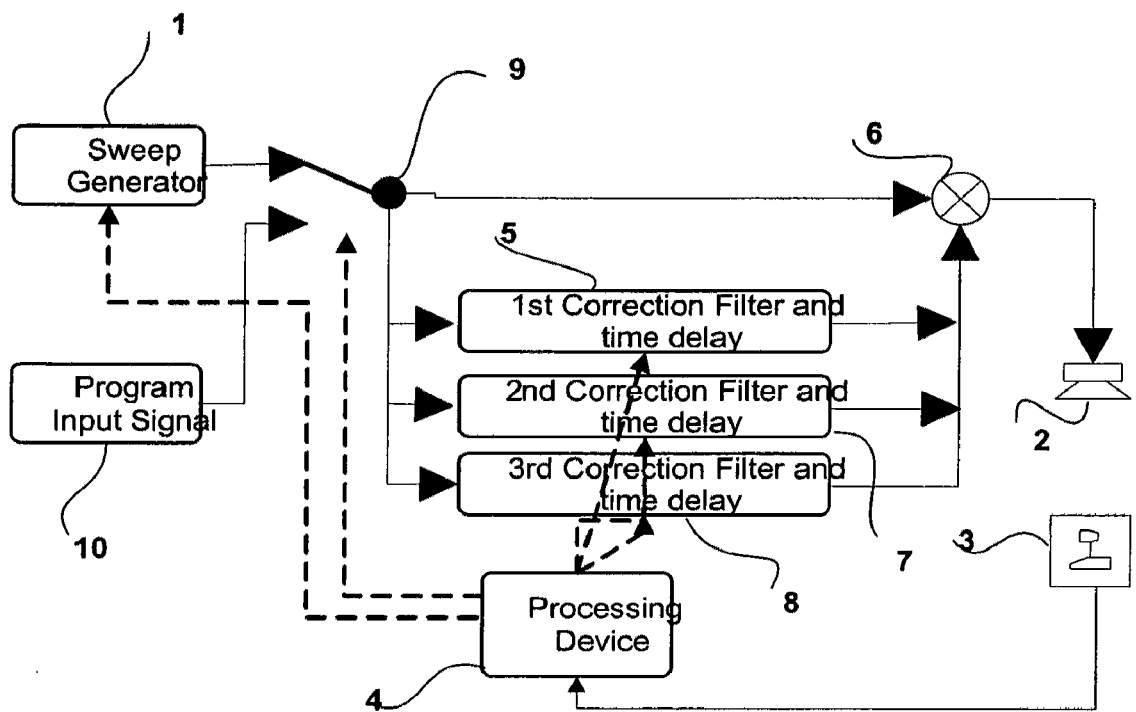
FIG. 2 is a diagram of an example system, according to an embodiment of the present invention.

FIG. 2 is a diagram of an example system, according to an embodiment of the present invention. For example, the system of FIG. 2 may be used to correct an in-room acoustic magnitude response of a subwoofer. The system comprises a generator 1 (e.g., a sweep generator or a swept sine-wave generator), an output device 2 (e.g., a sub-woofer), an input device or sensor 3 (e.g., a microphone), a controller 4, a first filter 5 (e.g., a correction filter), an adder or mixer 6, second and third filters 7 and 8 (e.g., correction filters), a switch 9, and an input signal 10.

In one example, a process for sequentially determining and correcting addressable peaks is initiated by connecting swept sine-wave generator 1, or other suitable signal source, to an input via switch 9. A first addressable peak is determined using swept sine-wave generator 1, for example, and monitoring an acoustic output of subwoofer 2 with microphone 3, for example, placed at a desired listening area. Controller 4 (e.g., a processing and control device, such as a digital signal processor (DSP) or other microcomputer incorporating signal processing functionality, such as analog-to-digital (A/D) conversion, and the like, as would become apparent to a person having ordinary skill in the digital signal processing art), can determine the frequency of a first addressable peak. Addressable peaks can be determined by many different methods or algorithms, as would be apparent to one skilled in the art.

By way of example, and not of limitation, an output of microphone 3 at individual frequencies may be compared to an average level of the correction passband, and the frequency with the greatest deviation can be identified as the first addressable peak, $f_c$. Then controller 4 may automatically derive a first correction filter 5 having a band pass centered at $f_c$, the frequency of the first addressable peak. In this embodiment, filter 5 can have a band-width of about one-third ($\frac{1}{3}^{rd}$) octave and a gain of approximately −6 dB. The input signal is passed through first correction filter 5, and delayed by a time $t=A/(2f_c)$, before being added to (e.g., superimposed with) input signal 10 (e.g., "audio signal", "program input signal", or just "program signal") path by adder 6. In this embodiment A=3.

In one example, after application of this first correction signal the process can be repeated an arbitrary number of additional times to identify additional addressable peaks for correction, beginning with the swept sine-wave to identify and correct any additional addressable peaks respectively, if they exist, by configuring second and third correction filters 7 and 8. In this embodiment, a total of three addressable peaks are identified and corrected. If no variations greater than a predetermined threshold are identified, or if additional addressable peaks are closer in frequency to previously identified addressable peaks than a predetermined interval, no correction may need to be applied.

In one example, the system is effective for values of threshold for peak determination in the range from about 3 db to 12 db, and for values of minimum addressable peak intervals equal to between one half to two times the correction filter band width. After identification and correction of addressable peaks (i.e., three peaks in this example) is completed, controller returns switch 9 to program input signal 10 for normal operation.

Additionally, or alternatively, with respect again to FIG. 1, $F_{1i}$ may be a high-pass filter at frequency approximately ⅓ octave below the center frequency of response peak ($f_{ci}$), having a slope of about 24 dB per octave, and Butterworth damping characteristics; $F_{2i}$ may be a low-pass filter at frequency approximately ⅓ octave above $f_c$, having slope of about 24 dB per octave, and Butterworth damping characteristics (for addressable peak "i"); and Time delay $t_i=T_{ci}/2$, where Tci is the period with associated $f_{ci}$. It is to be appreciated that $T_{ci}=1/f_{ci}$ such that $t=1/(2f_{ci})$ (for addressable peak "i"). In one example, the room-correction algorithm addresses 3 peaks (i=1, 2, 3) over the correction passband of about 40-200 Hz. Correcting multiple peaks may require additional sets of bandpass filters with attenuation and time delay specific to the peak addressed. Room-correction techniques occur downstream from variable low-pass (crossover), variable gain (volume) and upstream of feed-forward processing.

According to an embodiment of the present invention, latency associated with room-correction does not exceed about 5-10 ms, and generally is minimized. With reference again to FIG. 2, room-correction procedures and considerations can include a sine sweep stimulus (about 20-160 Hz) using generator 1, or tone burst stimulus at about ⅙th octave intervals (about 20-200 Hz, (20, 22, 25 Hz, etc.)). Using microphone 3 positioned at a listening location (such as at ear-height), microphone 3 can be "swept" through range of listening locations during room response acquisition so as to generate best average correction for those locations. In one example, peaks subject to correction are identified by their bandwidth and magnitude relative to average acoustic level, within the system's prescribed passband.

Room correction stimulus and acquisition parameters for an exemplary embodiment of the present invention are tabulated below in Table 1. It is noted that the correction filter bandwidth is about one-quarter of one octave. In this example, correction signals for the three addressable peaks are attenuated by about 3.0, 6.0 and 12.0 dB relative to the native signal respectively, and the time delay factors A for each of the three addressable peaks is 3.0.

TABLE 1

| stimulus frequency (Hz) | stimulus level (dB) | acquisition time (ms) | correction signal, lower bound (Hz) | correction signal, upper bound (Hz) |
| --- | --- | --- | --- | --- |
| 40.0 | −10.0 | 1000.0 | 36.7 | 43.6 |
| 43.3 | −10.0 | 1000.0 | 39.7 | 47.3 |
| 46.7 | −10.0 | 1000.0 | 42.8 | 50.9 |
| 50.0 | −10.0 | 1000.0 | 45.8 | 54.5 |
| 53.3 | −10.0 | 1000.0 | 48.9 | 58.2 |
| 56.7 | −10.0 | 1000.0 | 52.0 | 61.8 |
| 60.0 | −10.0 | 1000.0 | 55.0 | 65.4 |
| 63.3 | −10.0 | 750.0 | 58.1 | 69.1 |
| 66.7 | −10.0 | 750.0 | 61.1 | 72.7 |
| 70.0 | −10.0 | 750.0 | 64.2 | 76.3 |
| 73.3 | −10.0 | 750.0 | 67.2 | 80.0 |
| 76.7 | −10.0 | 750.0 | 70.3 | 83.6 |
| 80.0 | −10.0 | 750.0 | 73.4 | 87.2 |

TABLE 1-continued

| | | | | |
|---|---|---|---|---|
| 86.7 | −10.0 | 500.0 | 79.5 | 94.5 |
| 93.3 | −7.0 | 500.0 | 85.6 | 101.8 |
| 100.0 | −7.0 | 500.0 | 91.7 | 109.1 |
| 106.7 | −7.0 | 500.0 | 97.8 | 116.3 |
| 113.4 | −7.0 | 500.0 | 103.9 | 123.6 |
| 120.0 | −7.0 | 500.0 | 110.1 | 130.9 |
| 126.7 | −7.0 | 500.0 | 116.2 | 138.2 |
| 133.4 | −7.0 | 500.0 | 122.3 | 145.4 |
| 140.0 | −7.0 | 500.0 | 128.4 | 152.7 |
| 146.7 | −5.0 | 250.0 | 134.5 | 160.0 |
| 153.4 | −5.0 | 250.0 | 140.6 | 167.3 |
| 160.0 | −5.0 | 250.0 | 146.7 | 174.5 |
| 173.3 | −5.0 | 250.0 | 158.9 | 189.0 |
| 186.7 | −5.0 | 250.0 | 171.2 | 203.6 |
| 200.0 | −5.0 | 250.0 | 183.4 | 218.1 |

| attenuation re native signal (dB) addressable peak | | | time delay factor(x ½$f_c$) addressable peak | | |
|---|---|---|---|---|---|
| #1 | #2 | #3 | #1 | #2 | #3 |
| 3.0 | 6.0 | 12.0 | 3.0 | 3.0 | 3.0 |

Figure 3:
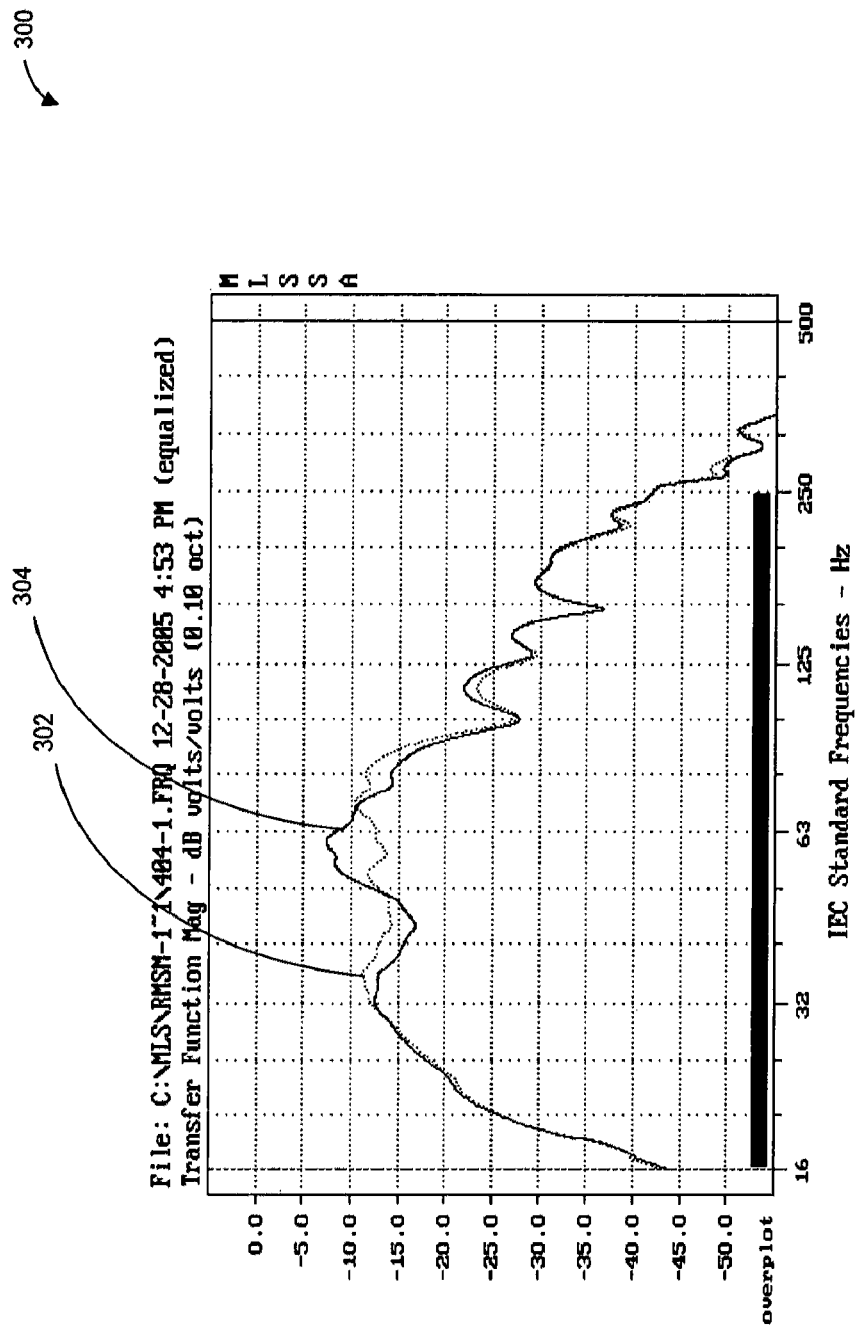
FIG. 3 illustrates an in-room acoustic magnitude response of a prototype subwoofer with and without room-correction, according to an embodiment of the present invention.

FIG. 3 illustrates a graph 300 of an in-room acoustic magnitude response of a prototype subwoofer showing a response 302 (lighter gray line) with room-correction and a response 304 (darker black line) without room-correction. In particular, FIG. 3 shows the acoustic magnitude response of a typical consumer oriented self-powered subwoofer measured at the desired listening location before and after a correction performed in accordance with an embodiment of the present invention, for example using a single correction filter. In the absence of the room correction scheme described herein, in-room response is characterized by a prominent peak centered at about 60 Hz and a companion dip below that frequency. The time delay associated with 60 Hz is be derived by the aforementioned formula in FIG. 1, where $t=A/(2f_c)=A\times 16.7$ ms (where A=1, 3 or 5). Thus, in this embodiment, the correction signal for the 60 Hz addressable peak is obtained by passing the input signal through a one-third ($\frac{1}{3}^{rd}$) octave bandpass filter centered at about 60 Hz, with a gain of approximately −6 dB, and a delay of approximately 3×16.7 ms (i.e., about 50.1 ms). Addition of the correction signal to the program input signal gives rise to the substantially flatter dotted line 302 (lighter gray line) magnitude response.

In yet another embodiment of the present invention, a sine-wave generator delivering a series of discrete frequencies in a pre-defined step-wise sequence is used instead of the swept sine-wave generator (1) of FIG. 2.

In still another embodiment, the methods of any of the previously described embodiments can be fully automated. For example, the process of room response correction can be initiated by pressing a button on a product or on a remote control supplied with the product, as would be understood by a skilled artisan. As described previously, embodiments of the present invention may proceed to sequentially identify and correct an arbitrary number of addressable peaks, and automatically store and implement the corrective filters and delays, and then return the system to normal operation when the corrective process is complete.

In still yet another embodiment, the predetermined threshold and predetermined interval for addressable peak identification are about 6 db and $\frac{1}{3}^{rd}$ octave respectively.

It will be apparent to those skilled in the art that many different variations of the basic methods disclosed herein fall within the scope of the present invention. By way of example, and not of limitation, the number addressable peaks identified and the number of corrective employed may arbitrarily large. For example, between 1 and 5 addressable peaks, and corresponding corrective filters, provides good results in most circumstances. Additionally, or alternatively, the time delay employed in the corrective signal, $t=A/(2f_c)$ where A equals an odd integer, may provides best results in most rooms for values of A=1, 3 or 5. However, larger values of A may be used in large rooms with good results. Additionally and as previously discussed, any suitable method may be used for the identification of addressable peaks for subsequent correction.

CONCLUSION

All patents and patent documents are incorporated herein by reference in their entirety. The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method for smoothing acoustic magnitude response of an audio reproduction system in a room that preserves subjective impression of transient response and dynamics, comprising:
   a) selecting an in-room magnitude response passband lower frequency and an in-room magnitude response passband upper frequency;
   b) placing subwoofer and a user-positionable microphone in a room;
   c) energizing said subwoofer with an audio signal within said magnitude response passband and generating an acoustic output signal within said room;
   d) performing an in-room acoustic magnitude response analysis and determining whether an addressable room resonance induced peak associated with said acoustic output signal is detectable with said microphone, wherein a room resonance induced peak is regarded as addressable if said peak's magnitude exceeds a mean level through a passband or a prescribed sub-passband;
   e) and if an addressable room resonance induced peak is detected, then filtering a replica of the audio signal at the room resonance induced peak; and
   f) adding the filtered replica signal with the audio signal, whereby smoothing the room resonance induced peak is achieved, such that a subjective impression of transient response and dynamics of the audio signal are preserved.

2. The method of claim 1, wherein the determining is performed at a listening area of the room.

3. The method of claim 1, wherein the determining comprises determining a region within a low frequency range of the audio signal that exceeds a predetermined mean level by about 3 decibels to about 12 decibels.

4. The method of claim 1, wherein the replica signal is delayed a time period equal to about an odd integer of one-half of a period of a frequency of the room resonance induced peak.

5. The method of claim 1, wherein the acoustic magnitude response analysis comprises using for said audio signal a swept sine wave, a tone burst, or a maximum length sequence technique signal.

6. The method of claim 1, wherein the acoustic magnitude response analysis determines between 3 and 5 peaks per octave.

7. The method of claim 1, wherein the filtering comprises bandpass filtering.

8. The method of claim 1, wherein the replica signal is delayed a time period $t_i = A/(2f_{ci})$ wherein $f_{ci}$ is a center frequency of the peak i.

9. The method of claim 8, wherein A is an odd integer less than or equal to 5.

10. The method of claim 1, wherein:
an interval between the peak and another peak is about 1/3 octave.

11. A system for smoothing acoustic magnitude response of an audio reproduction system in a room that preserves subjective impression of transient response and dynamics, comprising:
an acoustic magnitude response analysis device, wherein a room resonance induced peak is regarded as addressable if their magnitude exceeds a mean level through a passband of the loudspeaker or a prescribed sub-passband configured to determine a room resonance induced peak;
a filter configured to filter a replica of an audio signal at the room resonance induced peak; and
an adder configured to add the filtered replica signal with the audio signal, whereby a subjective impression of transient response and dynamics of the audio signal are preserved.

12. The system of claim 11, wherein the room resonance induced peak is detected at a listening area.

13. The system of claim 11, wherein the acoustic magnitude response analysis device is configured to determine the room resonance induced peak in a region within a low frequency range of the audio signal that exceeds a predetermined mean level by about 3 decibels to about 12 decibels.

14. The system of claim 11, wherein the replica signal is delayed a time period equal to about an odd integer of one-half of a period of a frequency of the room resonance induced peak.

15. The system of claim 11, wherein the acoustic magnitude response analysis device is configured to use a swept sine wave, a tone burst, or a maximum length sequence technique.

16. The system of claim 11, wherein the acoustic magnitude response analysis device is configured to determine between 3 and 5 peaks per octave.

17. The system of claim 11, wherein the filter comprises a bandpass filter.

18. The system of claim 11, wherein the replica signal is delayed a time period $t_i = A/(2f_{ci})$ wherein $f_{ci}$ is a center frequency of the peak i.

19. The system of claim 18, wherein A is an odd integer less than or equal to 5.

20. The system of claim 11, wherein:
the acoustic magnitude response analysis device is configured to determine another peak; and
an interval between the peak and the another peak is about 1/3 octave.

* * * * *